(12) United States Patent
Ogura et al.

(10) Patent No.: US 6,459,622 B1
(45) Date of Patent: Oct. 1, 2002

(54) TWIN MONOS MEMORY CELL USAGE FOR WIDE PROGRAM

(75) Inventors: Seiki Ogura, Hopewell Jct, NY (US); Tomoko Ogura, Hopewell Jct, NY (US)

(73) Assignee: Halo LSI, Inc., Wappingers Falls, NY (US)

( * ) Notice: Subject to any disclaimer, the term of this patent is extended or adjusted under 35 U.S.C. 154(b) by 0 days.

(21) Appl. No.: 10/099,030

(22) Filed: Mar. 15, 2002

Related U.S. Application Data

(60) Provisional application No. 60/288,756, filed on May 4, 2001, provisional application No. 60/279,151, filed on Mar. 27, 2001, and provisional application No. 60/275,870, filed on Mar. 15, 2001.

(51) Int. Cl.[7] .............................................. G11C 16/04
(52) U.S. Cl. ............................... 365/185.28; 365/185.03
(58) Field of Search ....................... 365/185.28, 185.03, 365/185.1, 185.14, 185.24, 149, 185.18

(56) References Cited

U.S. PATENT DOCUMENTS

| 6,248,633 B1 | 6/2001 | Ogura et al. ................. | 438/267 |
|---|---|---|---|
| 6,255,166 B1 | 7/2001 | Ogura et al. ................. | 438/257 |
| 6,330,184 B1 * | 12/2001 | White et al. ............ | 365/185.03 |
| 6,388,293 B1 | 5/2002 | Ogura et al. ................. | 257/365 |

OTHER PUBLICATIONS

E. Suzuki et al., "A Low–Voltage Alterable EEPROM with Metal–Oxide–Nitride–Oxide–Semiconductor (MNOS) Structures," IEEE Trans. on Electron Devices, vol. ED–30, No.2, Feb. 1983, pp. 122–128.

Y. Tarui et al., "Electrically Reprogrammable Nonvolatile Semi–conductor Memory," IEEE Journal of Solid State Circuits, vol. SC–7, No. 5, Oct. 1992, pp. 369–375.

T.Y. Chan et al., "A True Single–Transistor Oxide–Nitride–Oxide EEPROM Device," IEEE Electron Device Letters, vol. EDL–8, No. 3, Mar. 1987, pp. 93–95.

B. Eitan et al., "Can NROM, a 2 Bit, Trapping Storage NVM Cell, Give a Real Challenge to Floating Gate Cells?," Extended Abstracts, 1999 Conf. on Solid State Devices and Materials, Tokyo, 1999, pp. 522–524.

* cited by examiner

*Primary Examiner*—David Lam
(74) *Attorney, Agent, or Firm*—George O. Saile; Stephen B. Ackerman

(57) ABSTRACT

The present invention provides a method of memory cell selection and operation to obtain wide program bandwidth and EEPROM erase capability. Two storage sites within a memory cell can be simultaneously selected during read, program and erase. By proper biasing, each of the sites can be independently read and programmed. Also, during program, the source of energy to produce the current flow can be dynamically obtained from the stored charge on the selected bit line. If the bit line capacitance is not adequate to provide a charge that is necessary, additional bit line capacitance is borrowed from unselected bit lines, or a source follower select transistor may be used.

43 Claims, 8 Drawing Sheets

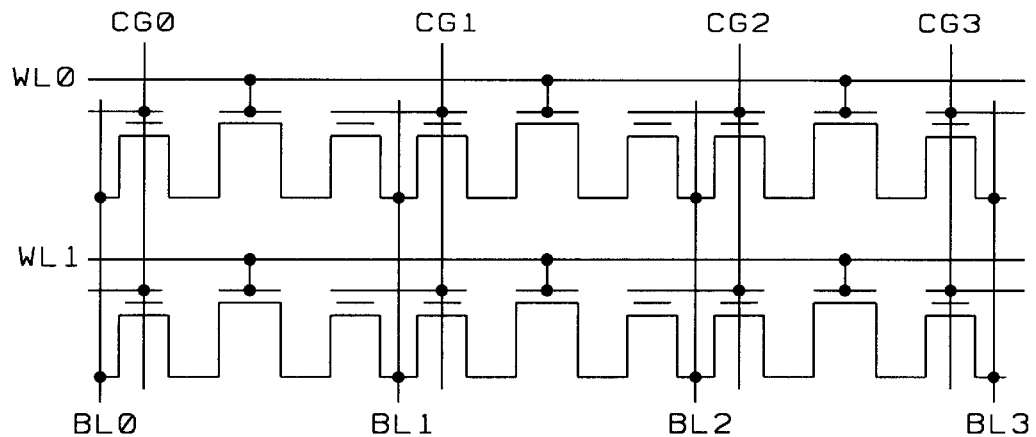
*FIG. 1A — Prior Art*
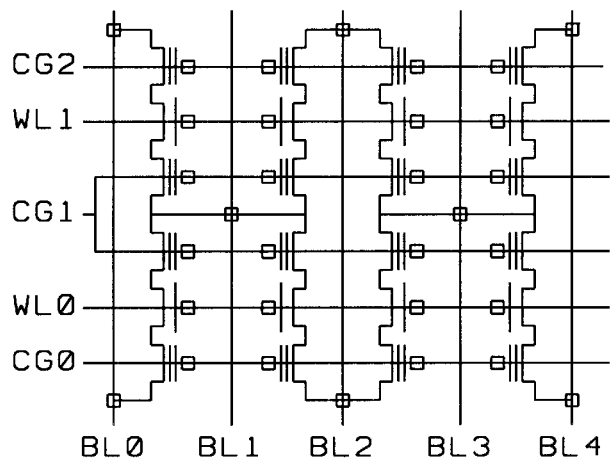
*FIG. 1B — Prior Art*

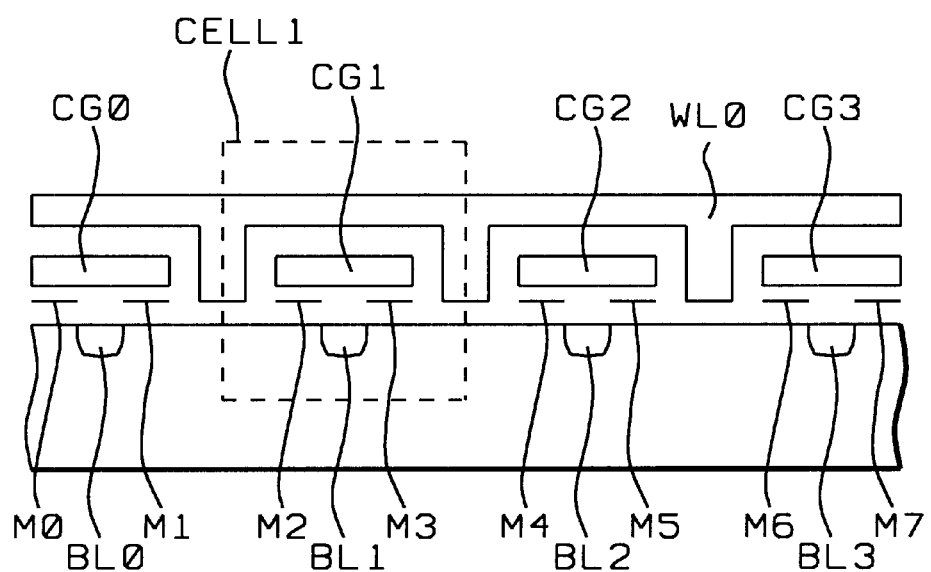
FIG. 2 – Prior Art

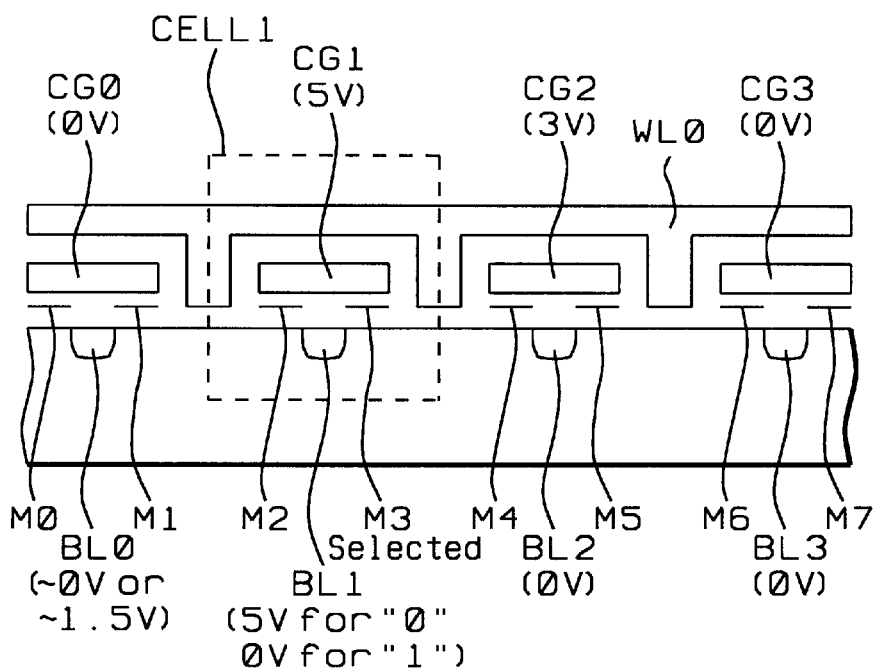
FIG. 3 – Prior Art
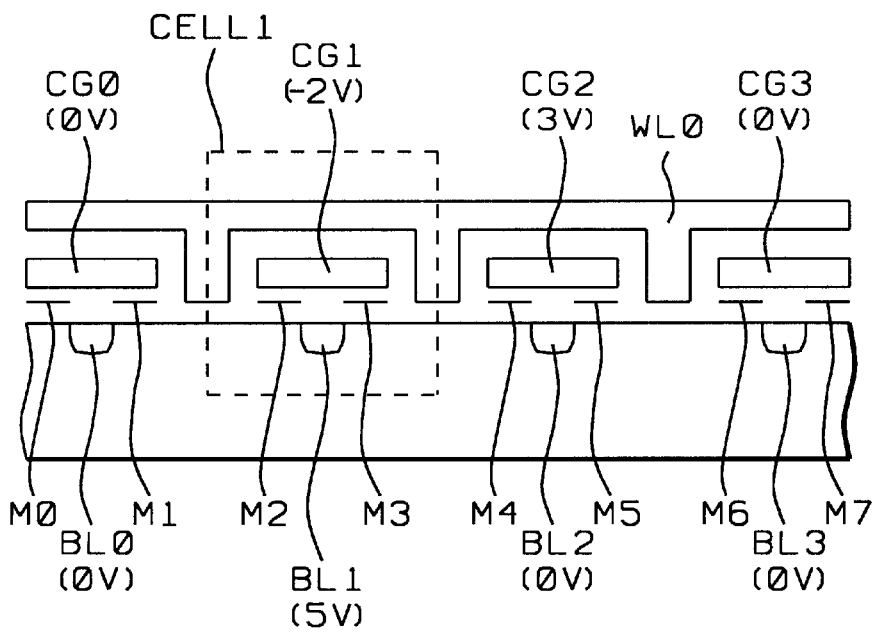
FIG. 4 – Prior Art

TWIN MONOS MEMORY CELL USAGE FOR WIDE PROGRAM

This application claims priority to Provisional Patent Application serial No. 60/(275,870, filed on Mar. 15, 2001, Provisional Patent Application serial No. 60/279,151, filed on Mar. 27, 2001, and Provisional Patent Application serial No. 60/288,756, filed on May 4, 2001 which are herein incorporated by reference.

BACKGROUND OF THE INVENTION

1. Field of Invention.

This invention relates to nonvolatile memory storage and in particular to MONOS memory.

2. Description of related art.

The twin MONOS memory cell was recently introduced in U.S. Pat. No. 6,255,166B1 (Ogura et al), directed to a nonvolatile memory cell and memory array with a method of programming the same, U.S. Pat. No. 6,248,633B1 (Ogura et al.), directed to process for making, programming and operating a dual bit multi level ballistic MONOS memory", U.S. patent application Ser. No. 09/595,059, dated Mar. 19, 2001, directed to nonvolatile memory cell and memory array, and the operating method of the same, and U.S. Patent Application Ser. No. 10/005,932, dated Dec. 5, 2001, directed to array architecture of nonvolatile memory and operation methods. FIGS. 1A and 1B show schematics of two examples for the MONOS type of memory cell. FIG. 1A shows a diffusion bit arrangement and FIG. 1B shows a metal bit arrangement. In either type of memory array, bit lines vertically connect the bit diffusions of the memory cell, and are separated by three transistors in series: one control gate memory transistor, one word gate select transistor, and another control gate memory transistor. Word gates act as memory cell selectors and are shared between adjacent memory cells. The word gates are connected horizontally by word lines. Control gates have an underlying oxy-nitride-oxide (ONO) film in which it is possible to trap-electrons to store data. One control gate can trap electrons in two separate sites, and is represented by two separated transistors, the gates of which may be either physically or electrically connected together to share the same-control gate voltage.

A cross section of one word line is shown in FIG. 2. Within a single memory cell, CELL1, there is a control gate CG1, and a bit diffusion BL1, as well as two half word gates. Underneath the control gate CG1 there are two memory nitride storage sites (NSS) M2 and M3. Electrons are injected into the storage sites to increase the threshold voltage of the device containing M2 and M3, and by doing such, program the storage site. The injection mechanism for the twin MONOS cell is called ballistic channel hot electron (CHE), since the nitride-storage site and the channel region underneath are very short. Electron injection efficiency is very high, on the order of 1E-4, because the short channel allows less energy attenuation by electron to electron scattering. More conventional planar floating gate devices using CHE have injection efficiencies on the order of 1E-6 to 1E-10. High voltages are required during program. These high voltages are provided by charge pump circuits. Conventional devices using CHE are characterized by high program currents in the order of 100 uA/cell and program times that are often in the tens and hundreds of microseconds. The number of cells that can be programmed at once is limited; therefore, the number of cells is limited by the charge pump maximum current.

In order to erase, which decreases the threshold of a memory cell CELL1, a high electric field is applied between the control gate CG1 and the bit diffusion BL1 in order to induce either Fowler-Nordheim tunneling or Hot Hole injection, or a combination thereof, through the oxide between the nitride and the diffusion. In one such implementation, a negative voltage of approximately –2V is applied to the control gate CG1, and a positive high voltage of approximately 4V is applied to the bit diffusion BL1. In the memory array organizations shown in FIG. 1, there are two nitride storage sites M2 and M3, which share the same control gate CG1 and the same bit diffusion BL1 that are usually erased together in one operation.

In the program operation however, the two nitride storage sites, which share the same control gate and the same bit diffusion may be programmed independently of each other. An example of program conditions for a twin MONOS memory array cross section are given in FIG. 3. In order to program the selected right nitride storage site M3, of the selected memory CELL1, the control gate CG1 is raised to +5V. The voltage of bit diffusion BL1 is determined by the program data. Usually the bit line is connected to a program data latch. The diffusion BL1 is raised to +5V if the cell is to be programmed to a logical "0". Otherwise if the program data is a logical "1" the voltage of BL1 is 0V. The adjacent right side bit line BL2 is grounded. When the word line voltage is raised to a voltage of approximately 1.2V, the channel under the word gate is opened and electrons are injected from the channel into the nitride of the selected storage site M3. In order to inhibit programming of the left side storage site M2 within the same memory cell CELL1, the left adjacent bit line BL0 and the adjacent left control gate CG0 are grounded to prevent current from flowing between BL0 and BL1, when the threshold of the M1 storage site is greater than zero.

However, even a small current between BL0 and BL1 can cause a serious program disturb condition. For that reason, if there is any possibility that the M1 storage site is an over erased cell with a negative threshold, it is better that the voltage on BL0 be raised to the word gate voltage, approximately 1.2V, in order to shut down the BL0 to BL1 current by the word gate device.

During programming, the two control gates CG[N] and CG[N+1] are raised to 3V and 5V, respectively, in order to program one of the nitride storage sites in a memory cell. To isolate programming to only one selected nitride storage site, the adjacent control gates CG[N–1] and CG[N+2] must be grounded, As illustrated in prior implementations of twin MONOS memory arrays, the minimum control gate decode is for four cells. The minimum bit line decode unit is also four cells, and the adjacent bit line next to the selected cell may need to be raised to hear the word line voltage in order to protect against an over-erased cell current during program.

FIG. 4 gives an example of voltage conditions for memory cell CELL1 during erase. A negative voltage of around –2V is, applied to the control gate CG1 and a positive voltage of around 5V is applied to the bit line BL1. Electrons are ejected from the nitride storage layer to the bit line. U.S. patent application Ser. No. 10/005,932, date Dec. 5, 2001, is directed to other possible erase mechanisms such as hot hole erase combined with word line voltage assistance. By biasing the selected word line to a negative voltage and the other word lines to a positive voltage, erase can be accelerated for the selected word line and inhibited for the unselected lines. Thus, it becomes possible to selectively erase data increments as small as a byte or even a single memory cell.

A characteristic of the short channel nitride storage region, which is implemented in the twin MONOS cell, is that program efficiency and erase efficiency can be very high.

SUMMARY OF THE INVENTION

It is an objective of the present invention to simultaneously select two nitride storage sites contained within a MONOS memory cell, for read, program and erase operations.

It is an objective of the present invention to program nitride storage sites contained within a MONOS memory cell.

It is further an objective of the present invention to program the plurality of nitride storage sites contained within a MONOS memory cell simultaneously.

It is still further an objective of the present invention to use the bit line capacitance to provide charge for a program operation.

It is another objective of the present invention to use bit line selector gates as a source follower to control the memory cell drain voltage and reduce the required bit line capacitance needed to supply current for programming cells of a memory site.

It is still another objective of the present invention to use bit line selector gates to select sub-bit lines to reduce bit line capacitance.

It is yet another objective of the present invention to use a higher voltage with a reduced bit line capacitance to program the nitride storage sites of a MONOS memory cell.

It is still yet another objective of the present invention to use the charge on bit line capacitance to supplement a high voltage source or charge pump by supplying a portion of the programming current needed for a cell, and thereby reducing the current requirements of the charge pump or high voltage source.

It is also another objective of the present invention to borrow capacitance from unselected bit lines to create enough capacitance to provide a total charge for a program operation.

It is also yet another objective of the present invention to disconnect the source of bit line charge from a bit line being programmed and then using the bit line charge to program the sites of a twin MONOS memory cell.

The present invention introduces a new method of memory cell organization and usage in which two nitride storage sites within one memory cell can be independently programmed in one operation. By this method, the program width can be doubled compared to the prior art program implementation, since the minimum decode unit changes from four cells to two cells.

An approach to improve program bandwidth comes from the usage of the array organization. Procedures that are needed to achieve the improvement are provided. Two nitride storage sites within a single memory cell can be independently programmed within a single operation by fixing the bit line voltage of the selected cell to a high voltage, and then determining the voltage conditions of the left and right adjacent bit lines based on the program data. Thus two adjacent memory elements under the same control gate can be independently programmed and at once doubling the program. bandwidth compared to the prior art programming method.

Program bandwidth is determined by the quotient of data width divided by programming speed. In order to improve program bandwidth, it is necessary to both increase the number of cells that are programmed at once, and reduce the time that it takes to program. This invention provides methods to improve program bandwidth.

The normal limitation of program width is caused by charge pump current limitations, which can be circumvented due to the high injection efficiency of the twin MONOS device. Also, the program data latch does not need to output high voltages, which reduces circuit complexity. The use of a source follower or drain current load device to limit bit line current during programming is also an approach to control and reduce programming current requirements and lessen the strain on the charge pumps.

Voltages applied to unselected cells adjacent to a selected cell provide a source of current to program a selected cell. When the bit line of an adjacent cell is at approximately 0V a current will flow between the bit line of the selected cell and the bit line of the unselected cell, thereby programming the nitride storage site in the selected cell that is above the area of current flow. When the bit line of the adjacent unselected cell is about or above the word line voltage there is no current flow and the nitride storage site of the selected cell is not programmed.

The capacitance of bit lines are used to provide a source of high energy electrons to program the storage sites of the MONOS memory cells. Capacitance of unselected bit lines is coupled to a selected bit line to provide sufficient energy to program a storage site. This is done by using bit line gates that select portions of a bit line and provide the capability of sharing unselected bit lines with a selected bit line so that the capacitance of the, unselected bit line can be used to provide energy for the programming of the memory cell connected to the selected bit line.

Bit line(s) that provide current to program a memory cell are first charged to a high voltage. A switch gate connecting the source of charge to the bit line(s) can be opened and the charge on the bit line(s) is used to program the nitride storage sites of the memory cell. If the bit line charge is not used as the total source of high energy electrons to program a memory cell, the bit line charge can be used to reduce the demands on current from the high voltage source. Also the switch gate can be used as a source follower to control the voltage to the bit line, which allows more tolerance for voltage fluctuations of the high voltage source, while still maintaining excellent controllability. These controllability and dynamic voltage charge concepts can be further extended to erase operations and multi-level program.

BRIEF DESCRIPTION OF THE DRAWINGS

This invention will be described with reference to the accompanying drawings, wherein:

FIG. 1A shows a schematic diagram of a portion of a memory or prior art constructed with MONOS memory cells, arranged in a "diffusion bit" configuration, FIG. 1B shows a schematic diagram of a portion of a memory or prior art constructed with MONOS memory cells, arranged in a "metal bit" configuration, FIG. 2 shows a cross section of a row of MONOS memory cells of prior art, FIG. 3 shows a cross section of a row of MONOS memory cells of prior art with voltage conditions for a program operation, FIG. 4 shows a cross section of a row of MONOS memory cells of prior art with voltage conditions an erase operation.

DETAILED DESCRIPTION OF THE PREFERRED EMBODIMENT

The two nitride storage sites within a single memory cell can be selected together as a unit during erase, program and read operation. A single memory cell can be erased as described in the prior arts section. In addition, because the erase efficiency of the short channel nitride storage is high, erase time is fast and can be implemented dynamically, by applying the positive and negative voltages on the selected bit line and control gate line, respectively, and then letting them float.

The two sites are independently read within a single operation by fixing the bit line voltage of the selected cell to a low voltage, applying a select voltage to the selected control gate, overriding the control gates that are adjacent to the cell, and then raising the word gate voltage. The voltages or currents of the two bit lines on both sides of the selected bit line can be monitored by two separate sense amplifiers to determine the memory state of the two storage regions.

Figure 5A:
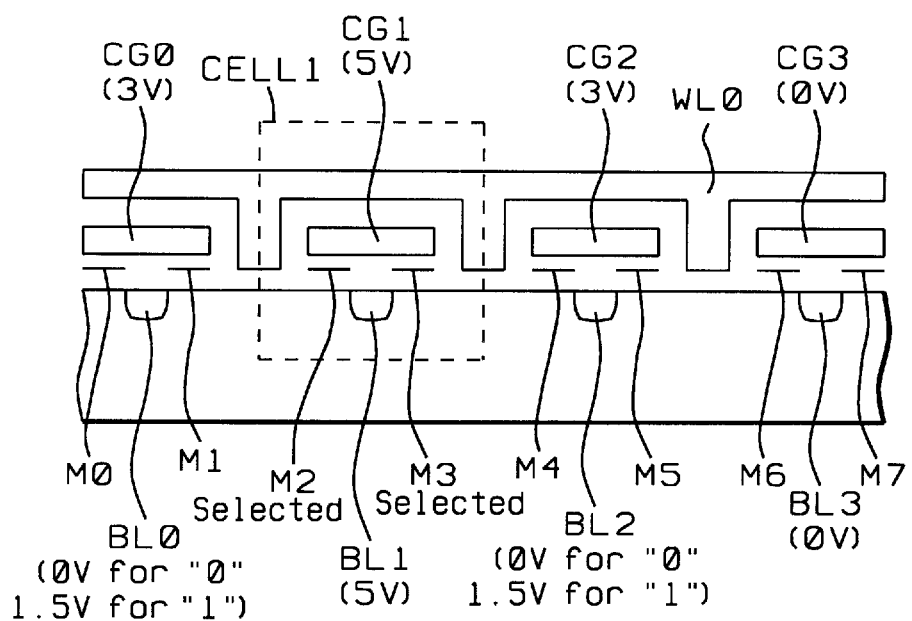
FIG. 5A shows a cross section of a row of MONOS memory cells with voltage conditions for a program operation of the present invention.
Figure 5B:
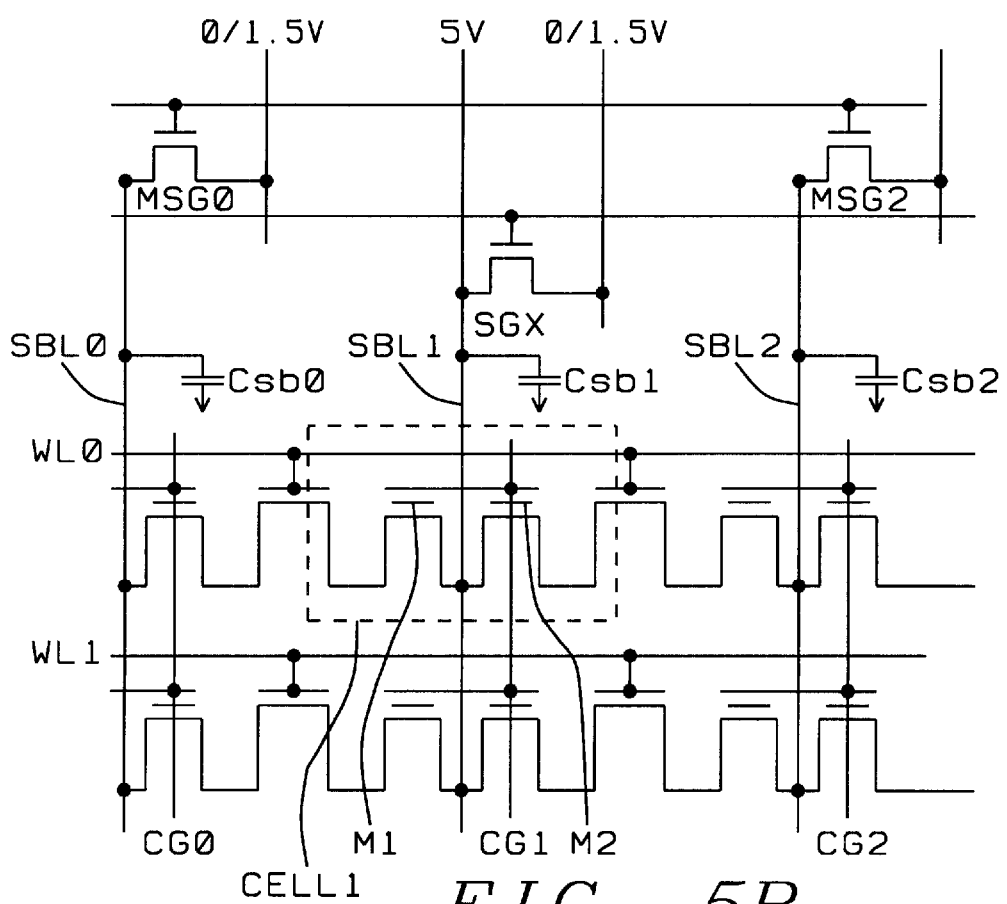
FIG. 5B shows a schematic diagram of a implementation of the dynamic program concept of the present invention.

The two sites within a single memory cell can also be independently programmed within a single operation by fixing the bit line voltage of the selected cell to a high voltage and then determining the voltage conditions of the left and right adjacent bit lines based on the program data. FIG. 5A shows the voltage conditions for programming two nitride storage sites in a twin MONOS memory cell simultaneously. The corresponding schematic for the diffusion bit array implementation is shown in FIG. 5B, where M0, M1, M2, M3, M4, M5, M6 and M7 are nitride storage sites of cells connected to a word line WL0 and having bit lines BL0, BL1, BL2, and BL3 and control gates CG0, CG1, CG2 and CG3. Memory cell CELL1 is the selected cell, which contains nitride storage sites M2 and M3. In order to program M2 and M3, a high voltage (5V) is applied to CG1, and an override voltage (3V) is applied to CG0 and CG2, The bit line BL1 is raised to a high voltage (5V), and a decoder controls separate program latches to connect voltages to BL0 and BL2 depending upon the program value of M2 and M3, respectively. If the data to be programmed is a logical "0", the voltage for BL0 or BL2 is 0V, and when the word line is enabled, program current flows between the 0V bit line to the high voltage (5V) BL1. If the data is a logical "1", the bit line voltage for BL0 and BL2 is set to a voltage about or greater than the selected word line WL0 voltage, which is about 1.2V, in order to inhibit the program current. The bit line voltage condition for a logical "1" is considered "program inhibit". The bit line decoder can control the bit line voltages for BL0 and BL2 separately, and the data of both nitride storage sites M2 and M3 can be independently programmed in the same program operation.

It should be noted, that unless explicit relationships are given between voltages conditions, the voltages given throughout this patent are approximate values used to simplify explanation and should not be construed as limiting in any way.

Figure 7:
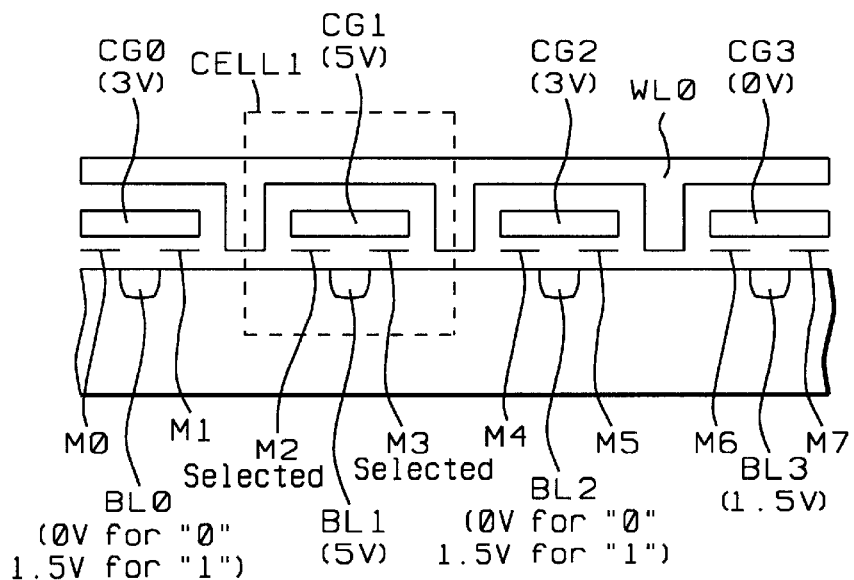
FIG. 7 shows a cross section of a row of MONOS memory cells with voltage conditions for protecting program disturb of the present invention.

It may be desirable to decrease the threshold of the low threshold '1' cell to a very low or even negative value in order to increase the cell current for high speed applications. In such over-erased cells, sub threshold leakage becomes a concern. Referring to FIG. 7, if there is any possibility that the storage site M6 is an over-erased cell with a negative threshold, even a small channel current or sub-threshold current can increase the threshold or cause serious program disturb during program of the adjacent cell CELL1. For this reason, it is better for that the bit line BL3 be raised to the above of the word gate voltage ~1.2V, which induces negative gate-source biasing between the word line and the bit line BL3 and shut downs the bit line BL2 to BL3 current path.

As a result of the high injection efficiency of the twin MONOS cell, the total charge needed for a program operation is on the order of several hundred electrons. There is a direct relationship between the amount;of charge released during program and the final threshold shift of the memory cell. Program speeds of less than one microsecond at program currents of a few microamperes are possible at the high injection rates. Therefore, it becomes possible to use the bit line capacitance as a source of the charge needed for electron injection, minimizing dependence on the charge pump current limit. For example, if the average program current is 2 uA, and the program duration is 1 usec, a capacitance of 2 pf is needed to ensure that the high bit line voltage stays at 5V plus or minus 0.5V (C=1/dtdV, where I=5 mA, dV=0.5V, and dt=1 usec). By this calculation, the bit line capacitance is sufficient to provide the charge needed for injection during program. This concept is useful in backup flash memory systems where data reliability is very important. If the appliance power should be accidentally and suddenly shutdown, the stored charge on the chip can be sufficient to complete the program operation.

An implementation of the dynamic program concept is described, based on the schematic shown in FIG. 5B. FIG. 5B shows a schematic diagram of an implementation of the "dynamic program" concept in which the bit lines SBL0, SBL1 and SBL2 and the control gate lines CG0, CG1 and CG2 are supplied with the appropriate voltages for programming CELL1, which contains nitride storage sites M2 and M3. Switches MSG0 and MSG2 connect either 0V or 1.5V (as noted in FIG. 5A) to the bit lines SBL0 and SBL2 that are adjacent to the bit line SBL1 of Cell1. After the voltages have been applied, a switch SGX connecting the high bit line voltage (+5V) to the bit line SBL1 can be disconnected. Programming occurs without any further supply of 5V to the memory cell bit line SBL1 because the bit line capacitance Csb1 provides the necessary charge.

The present invention focuses on the use of the bit line capacitance for the "dynamic program" concept, as well as "dynamically assisted program" concept. In the "assisted program" concept the charge stored on the bit line takes on a supplementary role. A high voltage source or a charge pump may be used to provide the high 5V needed during program, but the current requirement is less because the bit line capacitance supplements the current from the charge pump.

Figure 6:
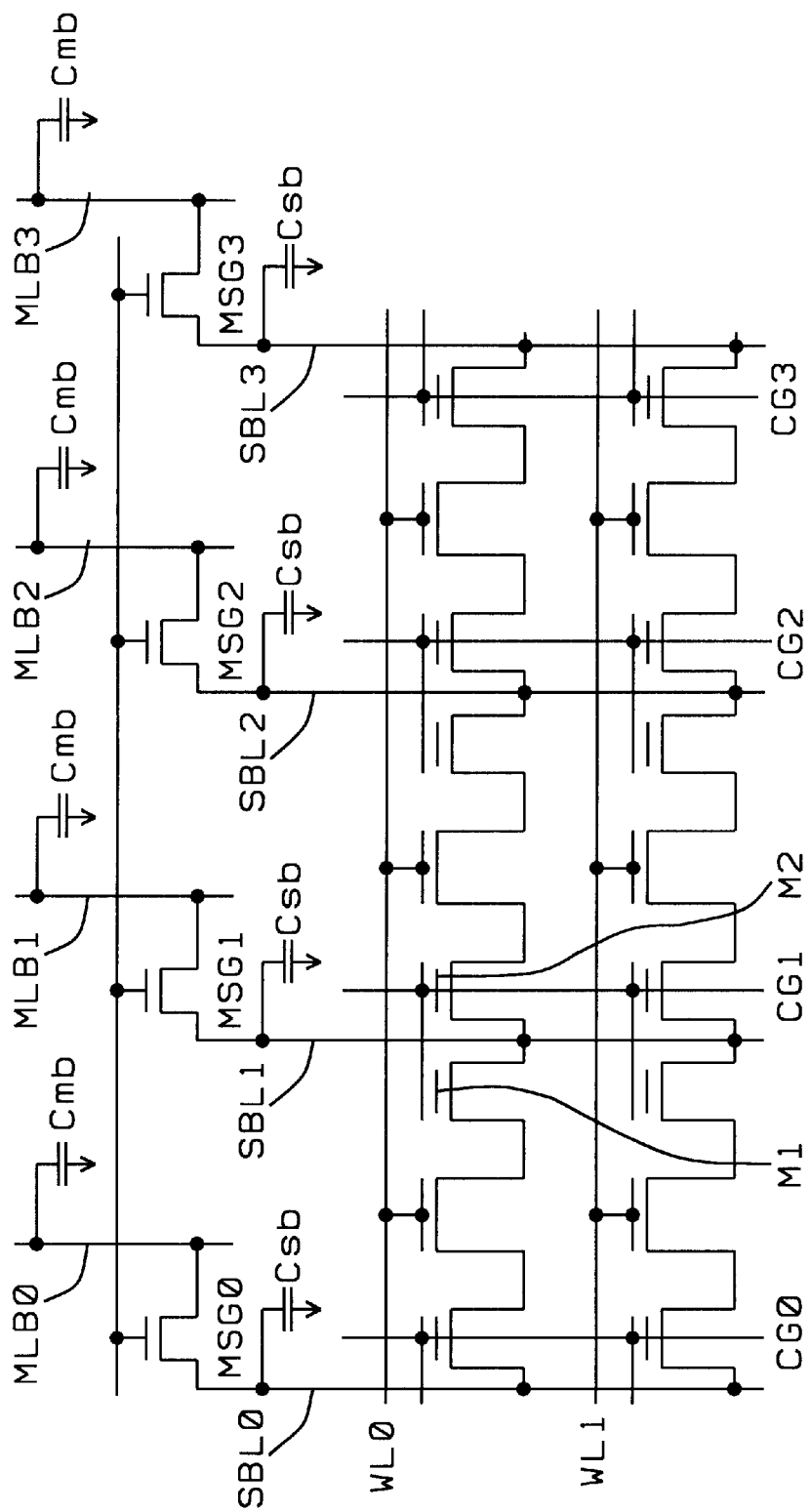
FIG. 6 shows a schematic diagram of the present invention where bit lines are subdivided by bit line select transistors.

In a second embodiment of the present invention, a smaller capacitor may be used with a higher voltage and a source follower voltage controlling a pass transistor in order to reduce the bit line capacitance requirement and increase the high voltage fluctuation tolerance. FIG. 6 shows a schematic diagram in which the bit lines are subdivided by bit line select transistors MSG0, MSG1, MSG2 and MSG3. The bit line select transistors MSG0, MSG1, MSG2 and MSG3 connect between sub bit lines SBL0, SBL1, SBL2 and, SBL3, respectively, and main bit lines MBL0, MBL1, MBL2 and MBL3, respectively, whenever the select gate signal SGBL is high. In addition to the function of sub bit line selection, the select transistors MSG0, MSG1, MSG2 and MSG3 can act as source follower voltage limiting devices. For example, applying 7V to the gate of a bit line select transistor with a threshold voltage of 2V can limit the voltage of the sub bit line to 5V or less (Vgs−Vt). If the main bit line is over charged, for example, to 7V, the total main bit line capacitance Cmb needed to keep the sub bit line from falling below 4.5V is only 0.8 pF (I=C dV/dt, I=2 uA, dv/dt=1 usec/(7−4.5)=2.5). A main bit line capacitance of 0.8 pF is significantly smaller than the 2 pf capacitance that is needed when the main bit line overcharging source follower method is not used. Also, the main bit line voltage fluctuation tolerance is 2.5V (=7−4.5) versus the sub bit line voltage fluctuation tolerance of 0.5V.

Figure 8:
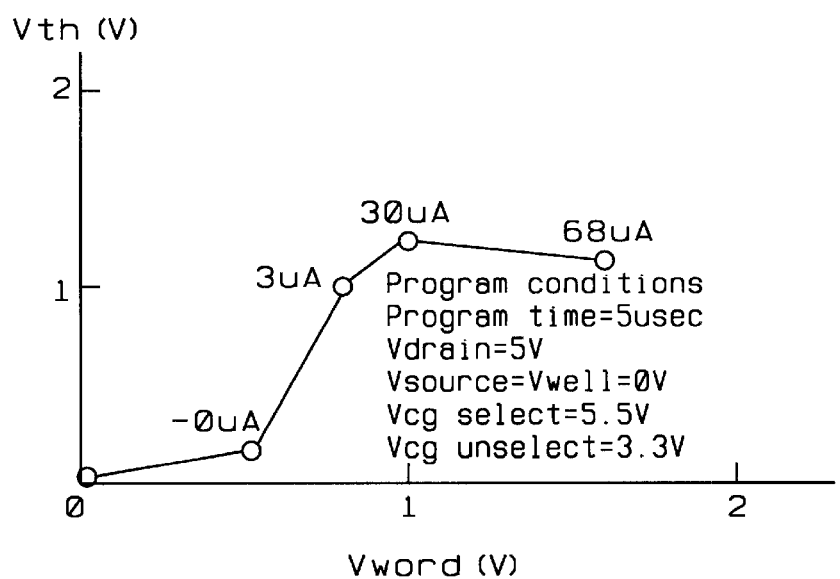
FIG. 8 shows the hardware results of the effect of word gate voltage and programming current on the final programmed threshold for the present invention.

In a third embodiment of this invention, another approach to increase program bandwidth comes from maximizing the number of programming cells programmed at once, which is usually limited by the programming current and the current capacity from a charge pump. As seen in the measured programming characteristics of the device, with a width of 0.4 um, shown in FIG. 8, when the word voltage is close to the word gate threshold, the programming current is below 1 uA. Programming speed is slower at this lower current, but quickly increases at program currents of around a few microamperes. However, if the current increases past 30 uA, the programming speed starts to falls. According to these un-optimized hardware results, a programming current of 2–3 uA (about 5 uA/um) is the best programming current to maximize the number of cells being programmed for a limited current charge pump. In addition to limiting the current by a low word line voltage as described previously, program current can also be controlled by a bit line current source.

Figure 9:
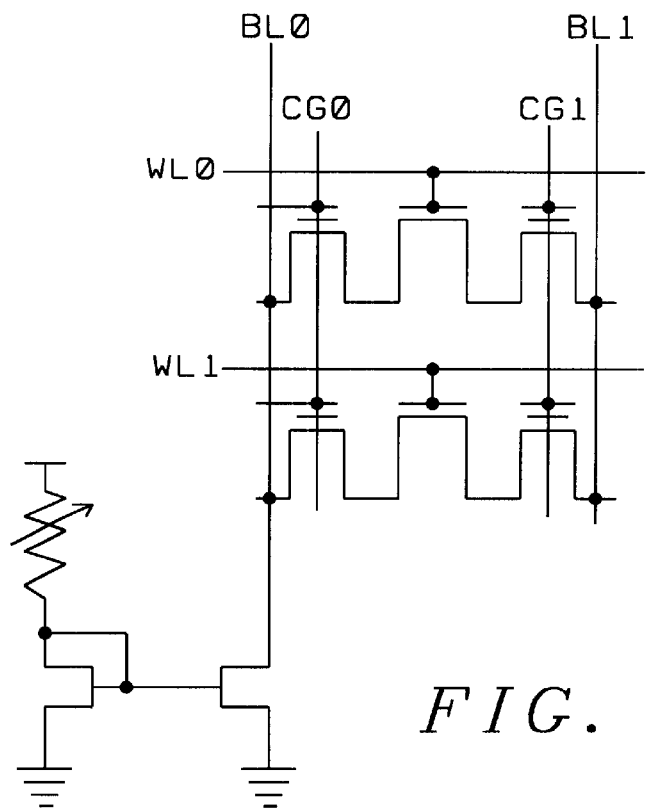
FIG. 9 shows a constant current source connected to a bit line of the present invention to assist in controlling the current needed to program a cell.

FIG. 9 shows an implementation in which a small constant current source is placed at the end of the twin MONOS source bit line BL0. The reference voltage Vref is supplied from a current source, which has been calibrated to the optimum low programming current. In the fourth embodiment of the present invention, when the bit line capacitance is not enough to meet the program time, current and voltage requirements, it is possible to borrow capacitance from an unselected bit line, in order to avoid an area penalty of an additional capacitor. Although there is no area penalty for the extra capacitance, the bit line decoder needs to be able to: 1) connect the selected and unselected bit lines together, and 2) the two adjacent bit lines next to the unselected bit line should be raised to a voltage near the selected word gate voltage (approximately 1.2V) in order to program inhibit the cell associated with the unselected bit line whose capacitance is being "borrowed". The number of cells located between the selected and unselected bit line must be at least four. By using the bit line capacitance borrowing method, the minimum bit line decode unit is eight cells.

Figure 10A:
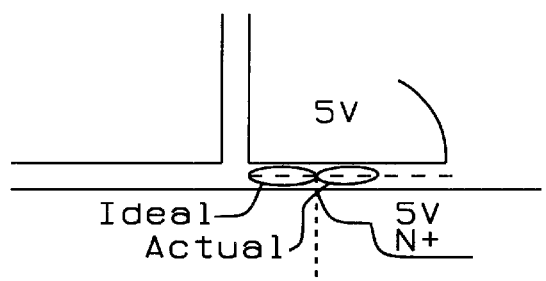
FIG. 10A shows a cross section of a region surrounding a storage site of the present invention.
Figure 10B:
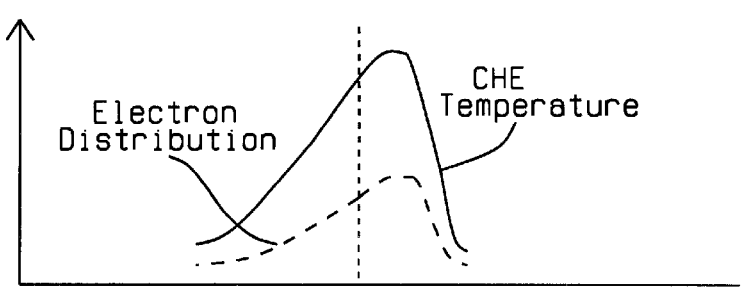
FIGS. 10B through 10D show distributions of electron distribution and CHE temperature for a control gate bias of 5V, and FIGS. 11A and B show the location for trapped electron distribution and CHE temperature for a control gate bias of 6.5V.
Figure 10C:
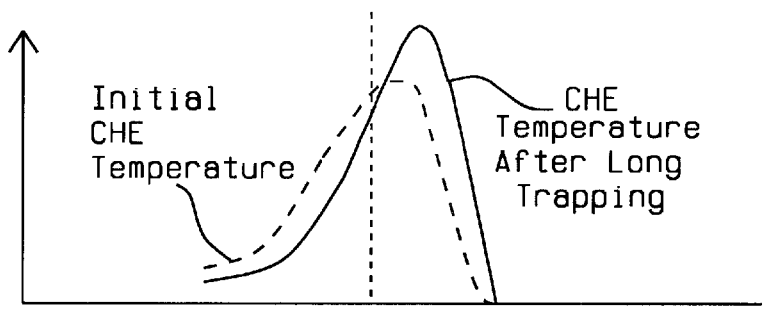
Figure 10D:
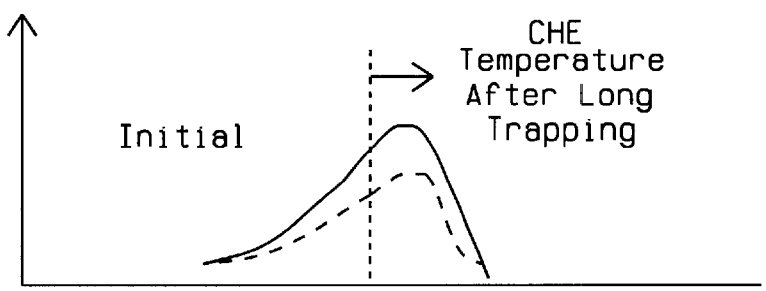
Figure 11A:
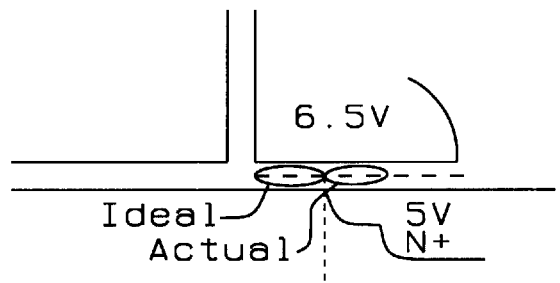
Figure 11B:
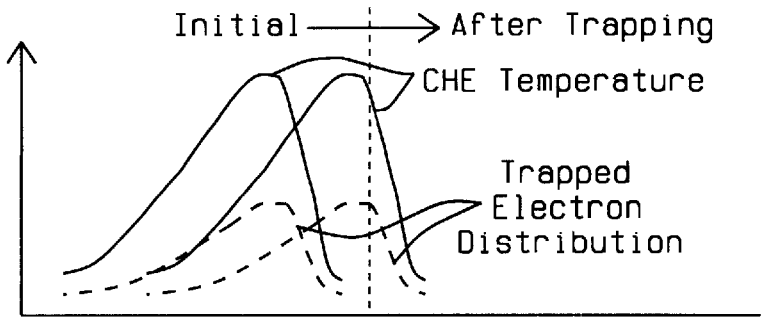

In the fifth embodiment of the present invention, program speed and overall device reliability is improved by controlling the injection point and profile of electron distribution. FIG. 10A shows a cross-section of the electron storage site region. The control gate and bit diffusion are biased with 5V. At Vds=5V, Vcg=5V and Vword=1.0, the temperature of the electrons under the control gate prior to electron injection is distributed as shown by the solid line in FIG. 10B. In this curve, the highest energy peaks slightly inside the n-junction. Thus, at the start of electron injection, the trapped electron distribution in the nitride storage sites will be similar to the temperature distribution and follow the dotted line curve shown in FIG. 10B. As more electrons are trapped, the peak of the electric field increases and also shifts further to the right, as shown by the solid line in FIG. 10C. In FIG. 10D is shown the distributions of CHE temperature and electron distribution after the electron trapping process has been sustained for a period of time. It can be seen that most of the majority of the electrons are trapped on the side above the h-junction, which do not contribute as effectively to threshold shift, because of the high n concentration. Also, when the injection point is near the junction edge, wear out of the bottom oxide is a concern. However, when a higher voltage around Vcg>~6.5V (drain bias+Vt and including substrate sensitivities) is applied to the control gate, the peak electric field is shifted left, closer to the gap between the word and control gate, as shown in FIG. 11A. The higher control gate voltage creates an electron inversion layer near the gap, which traps electrons in a more ideal location, directly above the control gate channel. Another advantage of the higher control gate voltage is that by filling the trap sites across the channel region, pin point wear out is avoided, which provides better endurance and reliability. Thus, the application of Vcg higher than (Vd+Vt) provides better electron distribution, which in turn results in better turn off characteristics as well as faster programming speed and better endurance.

While the invention has been particularly shown and described with reference to preferred embodiments thereof, it will be understood by those skilled in the art that various changes in form and details may be made without departing from the spirit and scope of the invention.

What is claimed is:

1. A method of programming a plurality of storage sites within a MONOS memory cell, comprising:
  a) selecting a first memory cell of a memory array containing a first and second storage site under control gates that may be physically or electrically connected together to form a single control gate,
  b) applying a first high voltage to a selected bit line of the first memory cell,
  c) applying a second high voltage to said control gate of said first memory cell,
  d) applying a first current determining voltage to a first bit line of a first unselected memory cell adjacent to said first memory cell,
  e) applying a second current determining voltage to a second bit line of a second memory cell adjacent to said first memory cell,
  f) programming said first storage site using CHE (channel hot electron) injection resulting from said first current,
  g) programming said second storage site simultaneous to programming said first storage site using CHE injection resulting from said second current.

2. The method of claim 1, wherein said memory array is either a metal bit line array or a diffusion bit line array.

3. The method of claim 1, wherein the second high voltage is higher than the first high voltage by a threshold voltage, in order to facilitate efficient, higher reliability program.

4. The method of claim 1, wherein disconnecting said high voltage from said selected bit line, programs said first and second storage sites using a stored charge on said selected bit line.

5. The method of claim 4, wherein programming said first and second storage sites using said stored charge on said selected bit line is done with high efficiency programming.

6. The method of claim 1, wherein said first current determining voltage produces a current flow between said first bit line and said selected bit line of said first memory cell when said first current determining voltage is a low value below a select voltage of a word line connected to said first memory cell and whereby said first current flows under said first storage site injecting electrons into said first storage site.

7. The method of claim 1, wherein said first current determining voltage produces no current flow between said first bit line and said selected bit line of said first memory cell when said first current determining voltage is a value above a select voltage of a word line connected to said first memory cell and whereby no current flows under said first storage site.

8. The method of claim 1, wherein said second current determining voltage produces a current flow between said second bit line and said selected bit line of said first memory cell when said second current determining voltage is a low value below a select voltage of a word line connected to said first memory cell and whereby said second current flows under said second storage site injecting electrons into said second storage site.

9. The method of claim 1, wherein said second current determining voltage produces no current flow between said second bit line and said selected bit line of said first memory cell when said second current deter mining voltage is a value above a select voltage of a word line connected to said first memory cell and whereby no current flows under said first storage site.

10. The method of claim 1, wherein said first and second storage sites are nitride storage sites located under a first and second control gate of said first memory cell.

11. The method of claim 1, wherein said simultaneous programming of said first and second storage sites doubles the maximum programming data width.

12. The method of claim 1, further comprising a source follower to control bit line voltage and reduce a bit line capacitance during program:
   a) coupling memory cell bit lines to sub bit lines,
   b) coupling sub bit lines to main bit lines with bit line selector transistors,
   c) applying a third high voltage to a gate of the bit line select transistor,
   d) applying a fourth high voltage to the main bit line.

13. The method of claim 12, wherein said source follower allows main bit line voltage fluctuations while maintaining a stable sub bit line voltage.

14. The method of claim 12, wherein the third high voltage is approximately a threshold voltage greater than the first high voltage.

15. The method of claim 12, wherein the fourth high voltage is greater than the first high voltage.

16. A method of borrowing bit line capacitance to provide sufficient high voltage stored charge to program a MONOS storage site, comprising:
   a) selecting a MONOS memory cell containing a plurality of storage sites, and connected to a selected word line using a word line select decoder, a selected bit line using a bit line select decoder, and a selected control line using a control line select decoder,
   b) selecting a first unselected bit line of an unselected memory cell from which to borrow a first capacitance to be used with a second capacitance of said selected bit line to provide charge to program a MONOS storage site,
   c) borrowing capacitance by connecting said first unselected bit line to said selected bit line using a bit line decoder to produce a combined capacitance,
   d) applying a first voltage to said first unselected bit line and said selected bit line to charge said combined capacitance.

17. The method of claim 16, wherein applying a second voltage to a second and third unselected bit lines adjacent to the said first unselected bit line to program inhibit aid unselected memory cell.

18. The method of claim 16, wherein connecting together said first unselected bit line and said selected bit line produces enough combined capacitance to program said storage sites at a predetermined voltage charge.

19. The method of claim 16, wherein said second voltage is disconnected from said first unselected bit line and said selected bit line, and said storage sites are programmed with CHE resulting from current flow from said charge on the combined capacitance.

20. The method of claim 16, wherein said charge on the combined capacitance supplements said second voltage to reduce current requirements of a voltage source producing said second voltage.

21. The method of claim 16, wherein applying said second voltage to said first unselected bit line and said selected bit line produces enough charge on said combined capacitance to program said plurality of storage sites.

22. The method of claim 16, wherein said second voltage is a high voltage that produces a current flow under said storage sites that is adequate to inject electrons into said storage sites.

23. The method of claim 16, wherein said second voltage is approximately equal to a select voltage on said selected word line.

24. The method of claim 16, wherein said bit line select decoder is used to subdivide bit lines into subsections thereby reducing bit line capacitance seen by selected cells.

25. The method of claim 16, wherein said control line select decoder is used to subdivide control lines into subsections thereby reducing control gate capacitance seen by selected cells.

26. A means for programming simultaneously storage sites of a MONOS cell, comprising:
   a) a means for selecting a MONOS memory cell,
   b) a means for connecting a high voltage to a bit line of said selected MONOS memory cell,
   c) a means for creating a first current flow under a first storage site within said memory cell,
   d) a means for creating a second current flow under a second storage site within said memory cell,
   e) a means for injecting electrons into said first storage site from said first current flow and into said second storage site from said second current flow, simultaneously.

27. The means of claim 26, further comprising a means for limiting said first and said second current flow to allow stored charge on said bit line to program said first and second storage sites when said high voltage is disconnected from said bit line.

28. The means of claim 26, further comprising a source follower means to connect a main bit line to said bit line of the MONOS memory cell, wherein said source follower allows said high voltage to fluctuate while controlling MONOS memory bit line voltage.

29. The means of claim 26, wherein the means for creating said first current flow is controlled by a voltage means applied to an unselected bit line adjacent to said first storage site.

30. The means of claim 29, wherein said voltage means creates a value below a word line voltage of said selected memory cell to cause said first current flow and program said first storage site.

31. The means of claim 30, wherein said program of said first storage site is by CHE (channel hot electron) means.

32. The means of claim 29, wherein said voltage means creates a value above a word line voltage of said selected memory cell to cause no first current flow and no program of said first storage site.

33. The means of claim 26, wherein the means for creating said second current flow is controlled by a voltage means applied to an unselected bit line adjacent to said second storage site.

34. The means of claim 33, wherein said voltage means creates a value below a word line voltage of said selected memory cell to cause said second current flow and program said second storage site.

35. The means of claim 33, wherein said program of said second storage site is by CHE (channel hot electron) means.

36. The means of claim 33, wherein said voltage means creates a value above a word line voltage of said selected memory cell to cause no second current flow and no program of said second storage site.

37. The means of claim 26, wherein said first and said second storage sites are nitride storage sites.

38. The means of claim 26, wherein the means for injecting electrons into said first storage site from said first current flow and into said second storage site from said second current flow, simultaneously doubles the programming bandwidth.

39. A bit line capacitance borrowing means to provide charge to program a MONOS storage site, comprising:
  a) a means for selecting a first MONOS memory cell containing a plurality of storage sites, and coupled to a selected word line and a first bit line,
  b) a means for selecting said first bit line,
  c) a means for selecting a second bit line associated with a second MONOS memory cell that is not selected,
  d) a means for borrowing capacitance by coupling said second bit line to said first bit line to produce a combined capacitance,
  e) a means for program inhibiting said second MONOS memory cell,
  f) a means for charging said first and second bit lines to a value sufficient to program the storage sites of the first MONOS memory cell.

40. The borrowing means of claim 39, further comprising a means to limit current flow from said capacitance to reduce amount of said combined capacitance.

41. The barrowing means of claim 39, wherein said means for borrowing capacitance creates a combined capacitance of said first and second bit lines that when charged to a predetermined voltage, produces current flow sufficient to program the storage sites of the first MONOS memory cell.

42. The barrowing means of claim 39, wherein said means for selecting said first bit line, selecting second bit line, and program inhibiting said second MONOS memory cell is done with a bit line decoder with a minimum decode unit greater than one.

43. The borrowing means of claim 39, wherein the means for program inhibiting said second MONOS memory cell requires a selection of bit lines adjacent to either side of said second MONOS memory cell that are coupled to a voltage approximately equal to a select voltage of said selected word line.

* * * * *